US011163005B2

United States Patent
Jochum et al.

(10) Patent No.: US 11,163,005 B2
(45) Date of Patent: Nov. 2, 2021

(54) TEST DEVICE FOR TESTING A CONTROL UNIT OF A SWITCHING APPARATUS OF A SWITCHGEAR

(71) Applicant: OMICRON ELECTRONICS GMBH, Klaus (AT)

(72) Inventors: Michael Jochum, Altach (AT); Stephan Geiger, Feldkrich (AT); Rainer Küng, Raggal (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 544 days.

(21) Appl. No.: 16/077,952

(22) PCT Filed: Feb. 10, 2017

(86) PCT No.: PCT/EP2017/052961
§ 371 (c)(1),
(2) Date: Aug. 14, 2018

(87) PCT Pub. No.: WO2017/140582
PCT Pub. Date: Aug. 24, 2017

(65) Prior Publication Data
US 2021/0190864 A1     Jun. 24, 2021

(30) Foreign Application Priority Data

Feb. 15, 2016  (AT) .............................. A 50093/2016

(51) Int. Cl.
*G01R 31/327*     (2006.01)
(52) U.S. Cl.
CPC ..... *G01R 31/3277* (2013.01); *G01R 31/3274* (2013.01)
(58) Field of Classification Search
CPC .... G01R 31/025; G01R 31/041; G01R 31/06; G01R 31/2632; G01R 31/2813;
(Continued)

(56) References Cited

U.S. PATENT DOCUMENTS 5,734,207 A * 3/1998 LeCourt ................. H02H 9/002
                                                     307/127
6,426,632 B1 * 7/2002 Clunn .................. G01R 15/183
                                                     324/424
(Continued)

FOREIGN PATENT DOCUMENTS

AT          515592       10/2015
DE       102011086412     5/2013
(Continued)

OTHER PUBLICATIONS

PCT Search Report issued in PCT/EP2017/052961.
Austrian Search Report issued in A 50093/2016.

*Primary Examiner* — Thang X Le
(74) *Attorney, Agent, or Firm* — Greenblum & Bernstein, P.L.C.

(57) ABSTRACT

Test device having a signal input with a positive pin and a negative pin, between which an-input signal may be applied. Test device has a separation unit which is connected to the positive pin and to the negative pin and is configured to separate a positive signal component in the form of a positive track from the input signal, to output said signal component at a first pin, to separate a negative signal component in the form of a negative track from the input signal and to output said signal component at a second pin. The use of the test device to test a control unit of the switching device is described, wherein the test device simulates the switching device, the signal input of the test device is connected to the control unit and the control unit outputs an input signal to the signal input.

8 Claims, 2 Drawing Sheets

Figure 2:
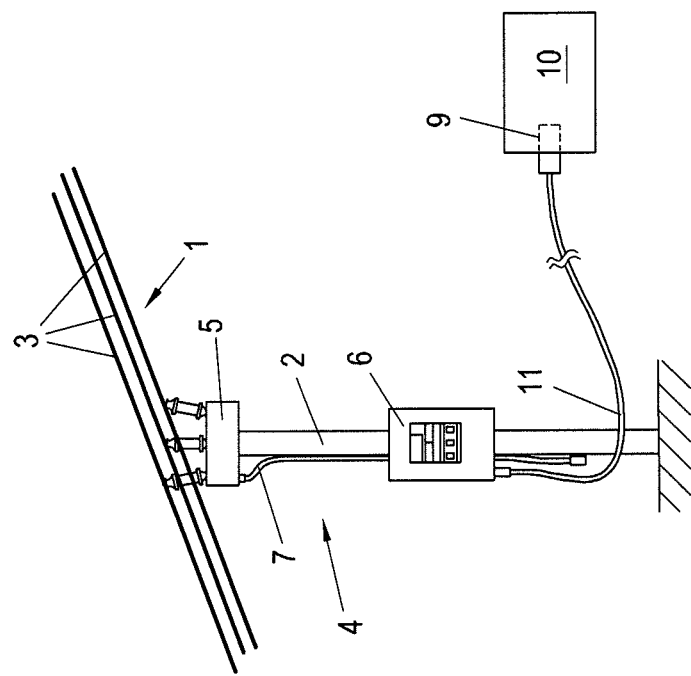

(58) Field of Classification Search
CPC .............. G01R 31/327; G01R 31/3272; G01R 31/3275; G01R 31/3277; G01R 31/3274
See application file for complete search history.

(56) References Cited

U.S. PATENT DOCUMENTS

| | | | |
|---|---|---|---|
| 6,750,567 B1 * | 6/2004 | Elli ................... | H01H 11/0062 307/143 |
| 7,499,251 B2 * | 3/2009 | Byron ................ | H02H 1/0015 361/42 |
| 9,329,228 B2 * | 5/2016 | Chen ................. | G01R 31/2853 |
| 9,772,379 B2 | 9/2017 | Fisher | |
| 10,353,002 B2 * | 7/2019 | Klapper ............ | G01R 31/3272 |
| 2005/0168365 A1 * | 8/2005 | Kaplan .............. | H03M 1/0665 341/143 |
| 2014/0327450 A1 | 11/2014 | Schmauss | |

FOREIGN PATENT DOCUMENTS

| | | |
|---|---|---|
| DE | 102014206366 | 10/2015 |
| EP | 2 273 278 | 1/2011 |
| GB | 2 034 997 | 6/1980 |
| JP | 1123639 | 1/1999 |

\* cited by examiner (State of the Art)

TEST DEVICE FOR TESTING A CONTROL UNIT OF A SWITCHING APPARATUS OF A SWITCHGEAR

The present invention refers to a testing device and to a method for testing a control unit of a switching device of a switchgear installation, wherein the testing device has a signal input. The invention also refers to the use of the testing device for testing a control unit of a switching device of a switchgear installation.

Frequently, devices for testing control units of electrical switching devices are required. In particular in the field of electrical protection systems and electrical energy supply, the testing of the operation of switching device and their respective control units is important and often even prescribed. For instance, in electrical medium voltage grids, switching devices mounted on poles are often provided with electromagnetic actuators, and are connected through control connections with the control units. Usually, a testing device is used which has to simulate the switching device. To this end, the switching device and the control connection are separated from the control unit and in their stead a testing device is connected through an adapter cable to the control unit, in order to test its operation. The testing device has to subsequently generate corresponding electrical signals, which cause the control unit to perform determined reactions. The reactions are detected and evaluated by the testing device.

Control units also have the task to briefly output a positive voltage on the coil of the actuator and thus open the switching device. In order to close the switching device, a negative voltage is output through the same or another control line. Typically, direct voltages between 12 and 250 V are used. The duration of the voltage impulses is typically in the range from 10 ms to 100 ms and depends on the form of the switching device. In order to enable a switching of the switching device, the switching device, i.e. in the first place the connected coil of the magnetic actuator, has often been initially recognized by the control unit, in order, for example, to recognize a defect control connection or to ensure that the switching device is connected. This recognition occurs through short pulses output by the control unit, wherein the pulses have obviously to be so short, that the switching device does not cause switching action. By measuring the reflowing current, the connected load (thus, in the first place, the resistance of the coil) is deduced. In order to determine the state of the actuator, i.e. whether the switching device is actuated or not, in some control unit it may be usual, that the impedance of the magnetic actuator is measured continuously or at intervals, since the impedance of the switching device depends on the state of the actuator.

Adapter cables are normally required for connecting these control lines of the control unit to the measurement input of a testing device. These adapter cables frequently contain an additional electronic or an additional electrical connection. In general, in the adapter cable, resistors are used to simulate the impedance of the coil of the magnetic actuator and thus to suggest a connected switching device to the control unit. Moreover, in the adapter cables, devices are required which separate the positive and negative voltages on the control lines and which convert them to positive voltages and forward separately (thus over separate lines) to the testing device. These positive voltages may thus be applied to the testing device at two different binary signal inputs with two respective pins, whereupon the testing device may test the operation of the control unit.

The currently known solution thus requires additional components in order to enable the testing of the control unit. The production of adapter cables, which contain these components thus becomes more complex, costly and prone to errors. Furthermore, different adapter cables having different electrical properties have to be used, if switching devices with different electrical properties have to be tested. Moreover, a plurality of binary signal inputs of the testing device have to be provided, thus making the cabling itself more complex and prone to error.

The object of the present invention is thus to provide, based on above said state of the art, an improved functional testing of the switching device by means of a testing device.

This object is achieved in that the signal input of the testing device has a positive pin and a negative pin and is designed in such a manner that an input signal may be applied between the positive pin and the negative pin. The testing device also has a separation unit which is connected to the positive pin and to the negative pin and is configured to separate a positive signal component in the form of a positive track from the input signal and to output said positive signal component at a first pin and to separate a negative signal component in the form of a negative track from the input signal and to output said negative signal component at a second pin.

Thus, the testing device provides a ternary signal input. In contrast to a conventional binary input, the input voltage in the testing device is divided by means of the separation unit into a positive and negative track. The inventive solution requires no external components, in contrast to the state of the art, for dividing the signal into two tracks, and thus also occupies only half the number of inputs on the testing device. The invention allows the testing device to be directly connected to the control line, for testing the control, by means of an adapter cable, wherein the adapter cable does not require any electronics. The production of adapter cables is thus more cost effective and simpler. Also, the risk of faults in the components of the adapter cable is reduced to a minimum.

The testing device may thus be used for testing a control unit of a switching device of a switchgear installation, in that the testing device reproduces the switching device. The signal input of the testing device is connected to the control unit and the control unit outputs an input signal to the signal input.

The testing device advantageously has a logic unit, which is connected to the first and to the second pin and which processes the positive and negative track independently from each other.

Moreover, the testing device may have a comparator unit, which compares the positive track to a positive threshold and the negative track to a negative threshold.

Analogously, the testing device may have a detection unit, which detects the positive and/or negative edges of the positive track and/or of the negative track.

The separation unit may be advantageously formed by a rectifier, wherein the first pin is connected to a first input of the rectifier and to the positive pin and the second pin is connected to the second input of the rectifier and to the negative pin.

This embodiment is particularly advantageous from a cost perspective since only one full-wave rectifier is required, i.e. normally 4 diodes. It is possible to operate the rectifier in an idle state or draw an input current, which is represented by a fixed value, or which may be dynamically set—depending on the requirements of the application.

Moreover, a first analog/digital converter may be provided, which is connected to the first pin and which digitalizes the positive track and/or a second analog/digital converter, which is connected to the second pin and digitalizes the negative track.

Thus, a further processing of the positive or negative track may be performed in a digital form, whereby positive or negative thresholds, positive or negative edges, etc., may be analyzed in a simple way, for example in the logic unit, and based thereupon, measures may be set.

The signal input may be provided with digital input filters F, which, for example, cause an interference suppression or debouncing of input signals. Thus deglitch-filters may filter short interference pulses or debounce-filters may debounce the input signal. The parameters, such as the limiting frequency, and the filter run times, the debouncing times or the suppression times of the filters may be set due to the advantageous digital configuration, individually, depending on the requirements of the different switching devices.

The present invention is explained in the following with reference to FIGS. 1 to 3, which illustratively, schematically and non-limitingly show advantageous embodiments of the invention. In particular FIG. 1 shows a part of an electrical power grid, FIG. 2 shows the power grid having a separated connection between the switching device and the control unit, which is connected to a testing device for testing, and FIG. 3 shows an inventive circuit diagram of the testing device.

Figure 1:
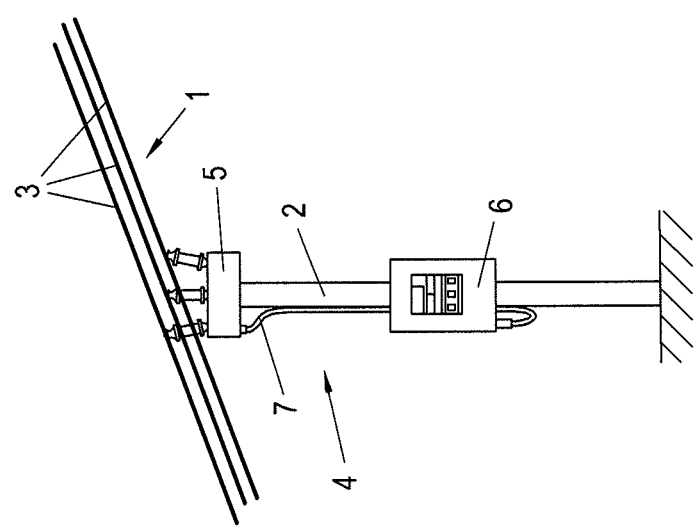

FIG. 1 shows a portion of an electrical power grid 1, which in the example shown is a three-phase overhead line, the lines 3 of which are conventionally stretched between poles 2. At a pole 2 a safety device in the form of a switchgear installation 4 is provided, which is composed of a switching device 5 and a corresponding control unit 6. The switching device 5 is a recloser, as known, for example, or a power switch made of a magnetic actuator containing a coil. The switching device 5 is able to separate or connect at least one of the lines 3 by means of a switching action activated by the control unit 6. However, the invention is obviously not limited to the use in an electrical power grid 1 in the form of an overhead line but may be used in any installation for transmitting or distributing electrical energy with safety devices in the form of switchgear installation 4 having a switching device 5 and a corresponding control unit 6.

The switching device 5 is therefore connected via a control line 7 to the control unit 6. The control line 7 therefore normally comprises a number of control lines for transmitting control input variables and control output variables. Control output variables usually activate switching actions. In this case, on the side of the control unit 6, individually for each phase, often separate signal outputs for a trip signal (i.e. the opening of the switching device 5) and for a close signal (i.e. the closing of the switching device 5), but also solely a binary signal input for trip and close may be used. In particular control output variables are relevant to the invention. These control output variables are signals, which are generated by the control unit 6, such as a reaction to the control input variables, and through which the operation of the switching device 5 is controlled, such as by activating a switching measure. In this case, for example, the control unit 6 emits through the control lines 7 a positive pulse for the trip signal, or a negative pulse as a close signal, as control output variables.

Figure 3:
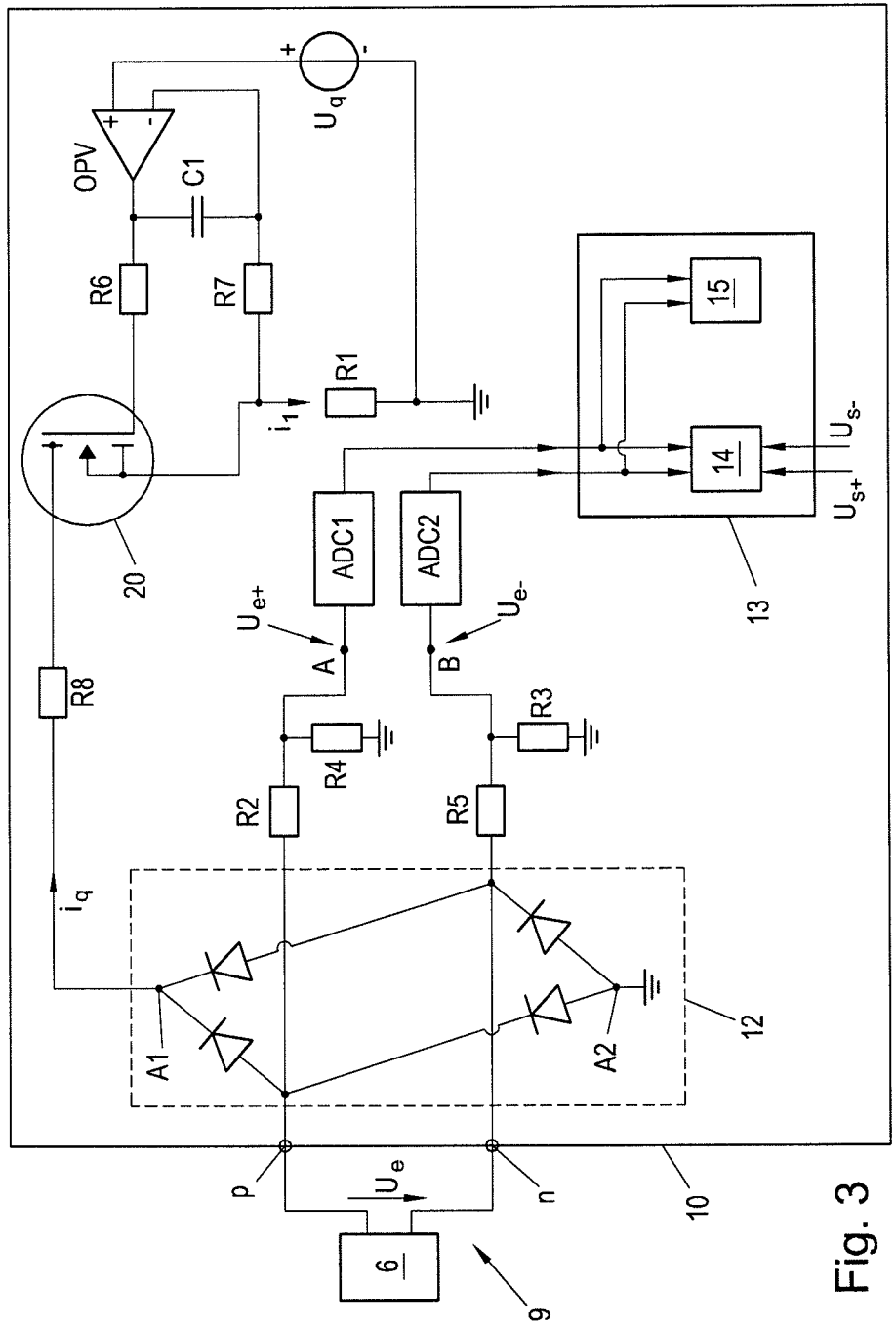

In order to test the switchgear installation 4, the control line 7 is disconnected between the switching device 5 and the control unit 6, as shown in FIG. 2. It would also be possible that the switching device 5, prior to testing, is not even connected to the control unit 6, such as during initial operation. Then the disconnecting of the control line 7 would be omitted. This happens frequently, since the control units 6 are frequently parametrized before installation and then functionally tested with the testing device 10, before these are brought into "the field" and installed. The control unit 6 is connected, for testing, with an adapter cable 11 to the testing device 10, which simulates the switching device 5, in order to test the correct operation and parametrization of the control unit 6 of the switching device 4. The adapter cable 11 is connected at one side to the signal output of the control unit 6 and on the other side to the signal output 9 of the testing device 10. Of course, also signal inputs of the control unit 6 and signal outputs of the testing device 10 may be contacted through the adapter cable 11. The testing device 10 is thus used for reproducing or simulating the switching device 5.

The testing device 10 receives, through the signal input, control output variables of the control unit 6, wherein testing devices 10 of the state of the art normally have binary signal inputs. The testing device 10 for reproducing the switching device 5 has thus to be configured for reproducing the signal inputs and signal outputs present in the switching device 5. It is not necessary that all signal inputs or outputs are used for testing. Usually, on the testing device 10, a signal input 9 for the trip signal and a signal input 9 for the close signal are respectively present, wherein each signal input 9 is in turn formed by two pins. To this end, in an electronic or circuitry provided in the adapter cable 11, the positive control signal (such as trip) or the negative control signal (such as close) is split and supplied to the respective binary signal input 9. This may occur as a positive or negative control signal, respectively, wherein for each signal input only one (positive or negative) switching threshold is possible. To this end, the adapter cables 11 are usually provided with electronics or an electrical circuitry, thus causing a cost increase of production of the adapter cable 11 and also negatively impacting its robustness.

Moreover, the switching device 5 has an impedance, which also has to be considered in the electronics or electric circuitry of the adapter cable 11 i.e. in form of resistors. Thus, for different switching devices 5 having different impedances different adapter cables 11 are required. This impedance is also dependent, for example when the switching device 5 is formed by a magnetic actuated actuator, from the switch position of the switching device 5. This means that when simulating the switching device 5 by means of the testing device 10 and the adapter cable 11 in operation, as soon as a switching process is activated by the control unit 6, also the variable impedance through the testing device 10 or the adapter cable 11 has to be considered.

According to the invention, the signal input 9 of the testing device 10 has one positive pin p and a negative pin n and is configured in such a way that an input signal $U_e$ may be applied between the positive pin p and the negative pin n, as shown in FIG. 3. The testing device 10 also has a separation unit 12, which is connected to the positive pin p and the negative pin n and which is configured for separating a positive signal portion in the form of a positive track $U_{e+}$ and for outputting the same to a first pin A, or providing the same internally, and for separating a negative signal portion in the form of a negative track $U_{e-}$ and to output the same to a second pin B, and/or providing the same internally.

The inventive testing device 10 thus allows the use of only one signal input 9 both for a trip signal and a close signal.

Since the signal input 9 is ternary, only a small number of inputs is required as compared to a binary embodiment of the signal inputs 9.

An inventive testing device 10 may reproduce the switching device 5 for testing a control unit 6 of a switching device 5 of a switchgear installation 4, wherein the signal input 9 of the testing device 10 is connected to the control unit 6, such as over an adapter cable 11, and wherein the control unit 6 outputs an input signal $U_e$ to the signal input 9.

Moreover, the testing device 10 may also have a logic unit 13, which is connected to the first pin A and the second pin B and which processes the positive track $U_{e+}$ and the negative track $U_{e-}$ independently from each other.

Moreover, the testing device 10 may have a comparator unit 14, such as in the logic unit 13, which compares the positive track $U_{e+}$ to a predetermined or set positive threshold $U_{s+}$ and the negative track $U_{e-}$ to a predetermined or set negative threshold $U_{s-}$.

The testing device 10 may also have a detection unit 15, such as in the logic unit 13, which detects the positive and/or negative edge of positive track $U_{e+}$ and/or of negative track $U_{e-}$.

Particularly advantageous is the case, where the separation unit 12 is formed by a rectifier, wherein the first pin A is connected to a first input terminal of the rectifier and to the positive pin p and the second pin B is connected to the second input terminal of the rectifier and to the negative pin. In other words, the first input terminal of the rectifier, the positive pin p and the first pin A and the second input terminal of the rectifier, the negative pin and the second pin B coincide. The separation unit 12 provided as a rectifier implies a reduced use of circuits.

Moreover, a first analog/digital converter ADC1 may be present, which is connected to the first pin A and digitalizes the positive track $U_{e+}$ and/or a second analog/digital converter ADC2, which is connected to the second pin B and digitalizes the negative track $U_{e-}$. This allows the digital processing of the positive track $U_{e+}$ and of the negative track $U_{e-}$ and a simple configuration of the comparator unit 14 and of the detection unit 15 in the form of software.

In FIG. 3, a possible embodiment of the invention is shown. At signal input 9, at positive pin p and negative pin n an input voltage $U_e$ is applied, which is supplied by the control unit 6 over the adapter cable 11. A separation unit 12 is connected, for example, in the form of a rectifier, to the positive pin p and the negative pin n. The positive pin p and the negative pin n are connected in this case to the input side of the rectifier.

The rectifier in the embodiment shown is a known bridge-type rectifier provided with diodes, wherein also other embodiments of the rectifier may be conceived.

By tapping the positive portion of the input voltage $U_e$ on the first pin A of the rectifier, a positive track $U_{e+}$ of the input voltage $U_e$ may be separated. By tapping the negative portion of the input voltage $U_e$ on the second pin B of the rectifier, a negative track $U_{e-}$ of the input voltage may be separated. In order to convert the positive track $U_{e+}$ and the negative track $U_{e-}$ into voltages, which may be processed by the first analog/digital converter ADC1 and by the second analog/digital converter ADC2, the positive track $U_{e+}$ and the negative track $U_{e-}$ are respectively converted by means of a voltage divider in the form of resistors R2 and R4, and R5 and R3, respectively, to a lower voltage value. The digitalized values of the positive track $U_{e+}$ and of the negative track $U_{e-}$ are supplied to a logic unit 13, which in this case contains a comparator unit 14, and are processed independently from each other. The comparator unit 14 compares the positive track $U_{e+}$ or the negative track $U_{e-}$ to a predetermined positive threshold $U^{s+}$ or a predetermined negative threshold $U_{s-}$. From this, a trip or close signal sent by the control unit 6 may be deduced. Digital filters may be provided in the logic unit 13. A huge advantage of the digital filter system are the filter parameters, which may be set during operation in a different way depending on requirements. It is of course also possible to place analog filters before the ADCs, however with the drawback of the fixed parameters and the additional circuitry.

The provision of the separation unit 12 in the form of a rectifier at the input has advantages related to the circuit, since the use of a unipolar voltage supply or ADC conversion is enabled, and a controlled current source may be easily obtained by means of a MOSFET.

It would of course also be possible to provide a bipolar signal input 9 and then generate the positive track $U_{e+}$ and the negative track $U_{e-}$ digitally from the input voltage $U_e$. However, this solution has some drawbacks with respect to the previous embodiment: the production of the ADCs, in particular of their voltage supply is more complex and a voltage-controlled current source cannot be provided by means of only one MOSFET. On the contrary, a bipolar voltage-controlled current source would be required, which would imply much more complex circuitries. A possible embodiment would comprise, for example, a respective n-channel MOSFET and a p-channel MOSFET. This solution may thus only be provided in a costly and complex cable solution, since twice as many (binary) inputs and, as said, additional adjustable impedances are required.

The rectifier of FIG. 3 may also operate with highly resistive connected output terminals A1, A2, of the rectifier, thus almost in an idle state. A closed circuit is anyway required, in order for the rectifier to effectively operate and thus allow the separation of the positive and negative tracks.

However, in order to simulate the impedance of the switching device 5 by the testing device 10 in the form of a dynamically adjustable input impedance Z of the testing device 10, a controlled current sink 20 may be present in the testing device 10, wherein the current sink is connected to the signal input 9, wherein the controlled current sink 20 shunts an input current $i_q$ from the signal input 9.

In a particularly advantageous embodiment, the controlled current sink 20 is formed by a controlled control circuit, in which a controlled voltage source $U_q$ and a shunt R1, connected to a reference potential, such as mass, are provided. The magnitude of the input current $i_q$ of the controlled current sink 20 is set via a current $i_1$ flowing over the shunt R1, wherein the current $i_1$ is set by the controlled voltage source $U_q$ and approximately corresponds to the input current $i_q$.

In FIG. 3, the signal input 9 is connected via the separation unit 12, in this case the rectifier and the resistor R8, to the controlled current sink 20, such as an n-channel MOSFET. The MOSFET, as the controlled current sink 20, draws, through the drain input, from a first output of the rectifier, the input current $i_q$, which is set by the controlled voltage source $U_q$, the second output of the rectifier is at the reference potential (here, the mass). To this end, the controlled voltage source $U_q$ is connected to the non-inverting input of an operational amplifier OPV. The inverting input of the operational amplifier OPV is connected through a resistor R7 to the first terminal of shunt R1, whereby the voltage of the controlled voltage source $U_q$ is set on shunt R1, since the second terminal of shunt $R_1$ as well as the negative output of the voltage source $U_q$ are connected to the reference potential (here, the mass). Thus, a current which approximately corresponds to the input current $i_q$ drawn through the controlled current sink 20 flows over the shunt $R_1$. The first terminal of shunt R1 is connected to the source input S of MOSFET. Between the non-inverting input of the operational amplifier OPV and the output of the operational amplifier OPV a capacitor C1 is connected. Moreover, the output of the operational amplifier OPV is connected through the resistor R6 to the gate of the MOSFET. Since the MOSFET preferably operates in the saturation region, the input current $i_q$, which corresponds to the drain current of the MOSFET, is set over the drain-source-voltage, i.e. further on over the controlled voltage source $U_q$.

The controlled current sink 20 may of course also be in the form of bipolar transistors, for example. Such a modification of the control however would cause a reduction of the dielectric strength.

The input protection resistor R8 has a positive temperature coefficient. In case of excessive input currents, the input protection resistor R8 acts as a reversible thermal protection, i.e. the value of the input resistor R8 increases with the input current iq, whereby the current sink 20 is protected against overcurrents. The operational amplifier OPV is a proportional controller, wherein the input voltage $U_q$ present at the non-inverting input is corrected at shunt R1. The proportional resistor R7 provides, in the ratio to R1, the proportional portion of the proportional controller formed by the operational amplifier circuit. The current thus set at the output of the operational amplifier OPV is obtained from the ratio of the input voltage $U_q$ at the non-inverting input of the operational amplifier OPV to the resistance of the shunt R1. The capacitor C1 is used for stabilizing the controller, in that it reduces the amplification at higher frequencies. The gate resistor R6 is used for controlling the MOSFET.

An inventive testing device 10 may thus be used for adjusting the input impedance Z through the adjustable input current $i_q$ and the applied input voltage $U_e$.

To this end, the controlled current sink 20 or the controlled voltage source $U_q$ controlling the controlled current sink 20 may be controlled via software. Thus, the input current $i_q$ shunted from the signal input 9 may be set, which provides the desired input impedance Z in combination with the input voltage $U_e$. The dynamically adjustable input impedance Z allows, on one hand, a simulation of various switching devices 5 with a testing device 10 without the need for different adapter cables 11 (except for different connectors, if needed). Moreover, an impedance of the switching device 5 depending on the switching status may be considered, since during operation/test of the testing device 10, the input impedance Z may be varied, as desired.

The invention claimed is:

1. A testing device for testing a control unit of a switching device of an electrical switchgear, the testing device comprising:
    a signal input, having a positive pin and a negative pin, is designed so that an input signal is applied between the positive pin and the negative pin, and
    a separation unit, which is connected to the positive pin and to the negative pin, is configured:
        to separate a positive signal component in the form of a positive track from the input signal and to output said positive signal component at a first pin, and
        to separate a negative signal component in the form of a negative track from the input signal and to output said negative signal component at a second pin.

2. The testing device of claim 1, further comprising a logic unit, which is connected to the first pin and to the second pin and which processes the positive track and the negative track independently from each other.

3. The testing device of claim 1, further comprising a comparator unit, which compares the positive track to a positive threshold and the negative track to a negative threshold.

4. The testing device of claim 1, further comprising a detection unit, which detects positive and/or negative edges of the positive track and/or of the negative track.

5. The testing device of claim 1, wherein the separation unit is formed by a rectifier, wherein the first pin is connected to a first input of the rectifier and to the positive pin and the second pin is connected to the second input of the rectifier and to the negative pin.

6. The testing device of claim 1, further comprising at least one of:
    a first analog/digital converter is provided, which is connected to the first pin and which digitalizes the positive track, or
    a second analog/digital converter is provided, which is connected to the second pin and which digitalizes the negative track.

7. The testing device of claim 1, further comprising an input filter, which is of digital type.

8. A method of using the testing device of claim 1, wherein for testing the control unit of the switching device of the switchgear installation, the testing device reproduces the switching device, and
    wherein the signal input of the testing device is connected to the control unit and the control unit outputs an input signal to the signal input.

\* \* \* \* \*